United States Patent
Chiang et al.

(10) Patent No.: US 9,041,188 B2
(45) Date of Patent: May 26, 2015

(54) AXIAL SEMICONDUCTOR PACKAGE

(71) Applicant: Vishay General Semiconductor LLC, Hauppauge, NY (US)

(72) Inventors: Wan-Lan Chiang, Taipei (TW); Chih-Ping Peng, Taipei (TW); Hui-Ying Ding, Tianjin (CN)

(73) Assignee: VISHAY GENERAL SEMICONDUCTOR LLC, Hauppauge, NY (US)

( * ) Notice: Subject to any disclaimer, the term of this patent is extended or adjusted under 35 U.S.C. 154(b) by 132 days.

(21) Appl. No.: 13/674,006

(22) Filed: Nov. 10, 2012

(65) Prior Publication Data

US 2014/0131842 A1    May 15, 2014

(51) Int. Cl.
| H01L 23/48 | (2006.01) |
| H01L 23/495 | (2006.01) |
| H01L 21/56 | (2006.01) |
| H01L 23/00 | (2006.01) |
| H01L 23/051 | (2006.01) |
| H01L 23/31 | (2006.01) |

(52) U.S. Cl.
CPC ............... *H01L 21/56* (2013.01); *H01L 24/01* (2013.01); *H01L 24/33* (2013.01); *H01L 23/051* (2013.01); *H01L 23/3107* (2013.01)

(58) Field of Classification Search
CPC . H01L 24/34; H01L 23/057; H01L 23/49811; H01L 23/49551; H01L 23/49524; H01L 23/49575
USPC ........... 257/694, 666, 696, 735, 690, E23.043
See application file for complete search history.

(56) References Cited

U.S. PATENT DOCUMENTS

| 3,621,114 | A | * | 11/1971 | Ref et al. ................. 257/694 |
| 5,166,098 | A | * | 11/1992 | Micic et al. ................ 29/855 |
| 5,227,995 | A |   | 7/1993 | Klink et al. |
| 5,334,553 | A | * | 8/1994 | Popat et al. ................ 29/827 |
| 5,506,174 | A | * | 4/1996 | Vandenheuvel et al. ...... 438/111 |
| 5,554,885 | A | * | 9/1996 | Yamasaki et al. ............ 257/666 |
| 6,919,625 | B2 | * | 7/2005 | O'Shea et al. ............... 257/685 |
| 7,098,543 | B2 | * | 8/2006 | Lai ............................ 257/778 |
| 7,242,078 | B2 | * | 7/2007 | O'Shea et al. .............. 257/676 |
| 7,397,171 | B2 | * | 7/2008 | Uetake et al. ............... 310/344 |
| 2001/0023088 | A1 |   | 9/2001 | Masuda et al. |
| 2002/0074638 | A1 |   | 6/2002 | Liao et al. |
| 2002/0130399 | A1 |   | 9/2002 | Moon |

FOREIGN PATENT DOCUMENTS

KR    10-0186309 B1    3/1999

* cited by examiner

*Primary Examiner* — Nitin Parekh
(74) *Attorney, Agent, or Firm* — Stuart H. Mayer; Mayer & Williams PC

(57) ABSTRACT

An axially-mountable device includes a semiconductor chip comprising lower and upper electrical contacts. A lower die pad is electrically and mechanically connected to the lower electrical contact of the chip. An upper die pad is electrically and mechanically connected to the upper electrical contact of the chip. A first axially extending electrical lead is electrically and mechanically connected to the upper die pad and extends in a first axial direction. A second axially extending electrical lead is electrically and mechanically connected to the lower die pad and extends in a second axial direction that is opposite to the first axial direction. Packaging material encapsulates the semiconductor chip, the upper and lower die pads and a portion of the first and second axially extending leads. The first and second leads extend from the packaging material and are adapted to allow the device to be axially-mounted with another electrical component.

12 Claims, 3 Drawing Sheets

AXIAL SEMICONDUCTOR PACKAGE

BACKGROUND

Axial packages are used to encapsulate a wide variety of dies or chips. Many different types of axial packages are available, many of which have been standardized. For instance, DO-41 is a package commonly used to encapsulate large power diodes such as those used in rectifiers. Other examples of standardized axial packages, which are generally standardized by the JEDEC Solid State Technology Association, include DO-15, DO-201AD and P600.

FIGS. 1a and 1b show an example of a typical axial package 10. FIG. 1a shows the components being aligned for assembly and FIG. 1b shows the components after assembly. The package 10 includes a die or chip 15, solder wafers 20, and leads 25 which terminate on one end with lead heads 30. As shown, the chip is located between the lead heads 30 and joined together by the solder wafers 20 after undergoing a high temperature reflow process during which the solder is melted. After the components are joined together they undergo a molding process to encapsulate them within a cylindrical body formed from a molding compound.

The axial package design shown in FIGS. 1a and 1b has a number of disadvantages. For instance, as seen in FIG. 1a, the components need to be carefully loaded and aligned with one another. Due to the nature of this process it is difficult to adopt an automatic process for piece part stacking and thus a manual process is generally employed. Another disadvantage is that different size chips need leads with different size lead heads, which in turn require different size assemblies in which the components are stacked and aligned. A single size lead head cannot be used for different size chips because it should fully cover the chip to prevent it from mechanical damage. However, the lead head should not be oversized because that would cause alignment problems. For this same reason a single size assembly in which to align the components is not practical. Thus, every time a new chip size is selected, all the related components need to be changed. As a result a large inventory of lead heads and assemblies need to be maintained.

Yet another disadvantage of the current axial package design is that there may be poor solder wetting because a solder flux process cannot be used to join the components since they are too fragile to go through a flux cleaning process. Without the use of a flux, significant solder voids may arise. To overcome this problem the subassembly is often exposed to a reducing atmosphere in a reflow or vacuum furnace. However, control and maintenance of the furnace needs to be carefully managed. Moreover, the solder reflow process is a manual process in which there are many factors that will affect soldering quality. These factors include the temperature profile, gas atmosphere, and the number of subassemblies that are placed in the furnace at the same time. Since each of these factors can vary there may be lot-to-lot inconsistencies among the final devices.

Accordingly, it would be desirable to provide an axial package design that overcomes the aforementioned problems.

SUMMARY

In accordance with one aspect of the invention, an axially-mountable device is provided. The device includes a semiconductor chip comprising lower and upper electrical contacts. A lower die pad is electrically and mechanically connected to the lower electrical contact of the chip. An upper die pad is electrically and mechanically connected to the upper electrical contact of the chip. A first axially extending electrical lead is electrically and mechanically connected to the upper die pad and extends in a first axial direction. A second axially extending electrical lead is electrically and mechanically connected to the lower die pad and extends in a second axial direction that is opposite to the first axial direction. Packaging material encapsulates the semiconductor chip, the upper and lower die pads and a portion of the first and second axially extending leads. The first and second leads extend from the packaging material and are adapted to allow the device to be axially-mounted with another electrical component.

DETAILED DESCRIPTION

Figure 2:
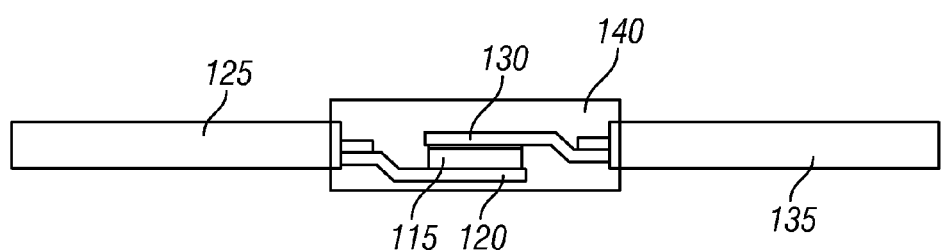
FIG. 2 shows a cross-sectional view of one example of an axial package housing an electronic component such as a semiconductor die or chip.

FIG. 2 shows a cross-sectional view of one example of an axial package housing an electronic component such as a semiconductor die or chip. The chip or die may any type electrode device such as power diodes, transient voltage suppressors, LED's and so on. As illustrated, a chip 115 is soldered to a surface of a first die pad 120 so as to establish electrical contact between the first die pad 120 and an electrode on a lower surface of the chip 115. The first die pad 120 extends in a plane parallel to the longitudinal or axial axis through the resulting axial package that is being fabricated. Likewise, the chip 115 is soldered to a surface of a second die pad 130 so as to establish electrical contact between the second die pad 130 and an electrode on an upper surface of the chip 115. The second die pad 130 also extends in a plane parallel to the longitudinal or axial axis through the resulting axial package that is being fabricated. As a result the chip 115 also extends in the axial or longitudinal direction. The die pads and leads may be formed from any suitable electrically conductive material such as copper.

The first electrical die pad 120 is electrically connected to a first axially extending lead 125 and the second electrical die pad 130 is electrically connected a second axially extending lead 135. In some embodiments the electrical connections may be established with a solder joint or laser welding. In another embodiment the die pads and their respective leads may be integrally formed as a single lead frame. The die pads 120 and 130 and the leads 125 and 135 are all oriented in the axial direction. However, they are offset from one another so that the die pads 120 and 130 extend in a different but parallel plane to the plane in which the leads 125 and 135 extend. In this way the die pads 120 and 130 are sufficiently close to one another so that each contact a respective surface of the die 115.

The completed structure includes a housing 140, which completely encapsulates the chip 115 and the die pads 120 and 130. The first and second axially extending leads 125 and 135 extend laterally outwardly from the device housing 140 to allow electrical connection to external devices. In the embodiment illustrated, the leads 125 and 135 extend in opposite directions from the device in a common plane, but this is by no means necessary. In one implementation the housing 140 has a generally cylindrical configuration in conformance with standard axial package designs. However, the housing may have other shapes as well. For instance, in some cases a rectangular shaped housing may be advantageous in some applications.

During manufacture, the chip 115 is typically solder-bonded to the die pads 120 and 130 by first applying a layer of solder to the die pad 120 and placing the chip 115 on the die pad 120. The unbonded upper surface of the chip can then be provided with a layer of solder. The die pad 130 can then be disposed on top of the chip 115, and the resulting assembly can be heated in a high temperature reflow process to the appropriate fusing temperature. In this way the bond between the semiconductor chip 115 and the die pad 120 and the bond between the semiconductor chip 115 and the die pad 130 can be formed at the same time.

In another implementation, the bond between the semiconductor chip 115 and the die pad 120 can be formed first, followed by the bond between the semiconductor chip 115 and the die pad 130. In this implementation the solder used on the upper surface of the chip can have a lower fusing temperature than the solder used on the lower surface of the chip. This will help prevent heat from the upper surface bonding process from softening the previously made lower surface bond.

Subsequent processes can be carried out in accordance with known technology used in the fabrication of devices using lead frames. For example, the resulting assembly can be disposed in a mold and a packaging material, for example, epoxy, can be forced into the mold under pressure. The material will flow around and completely encapsulates the chip and die pads. Upon hardening of the resin and opening of the mold, the device will comprise a solid resin envelope 140 having axial leads 125 and 135 extending therefrom.

Figure 1A:
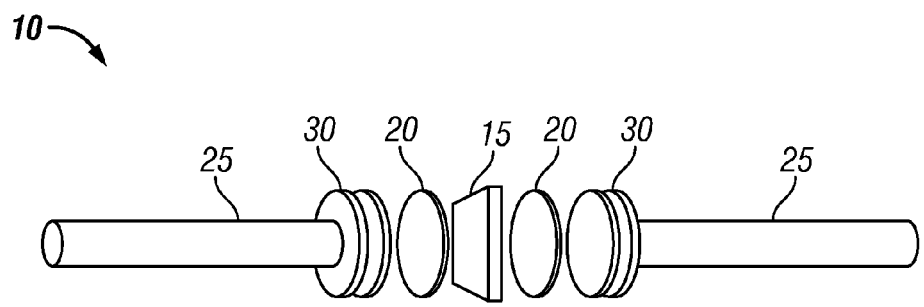
FIG. 1a shows the components of one example of a conventional axial package being aligned for assembly and FIG. 1b shows the conventional axial package after assembly.
Figure 1B:
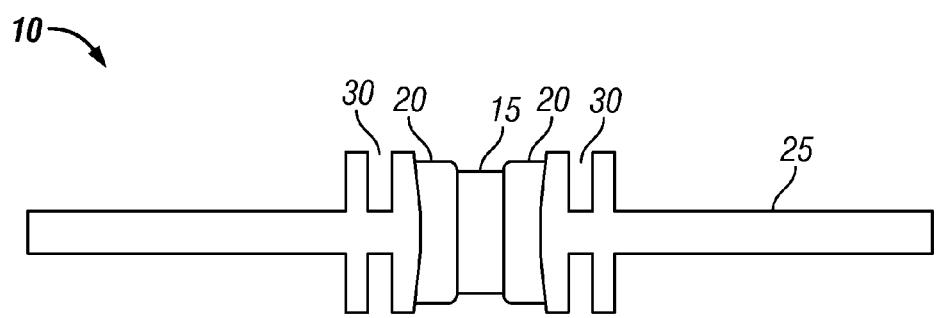

A number of advantages arise from the axial assembly design described above. First, it allows piece parts & dice inventory to be consolidated. Almost all the axial piece parts and tooling which are involved in the fabricating the device shown in FIG. 1 are no longer needed. Items that are no longer needed include different size lead heads and stacking boats to accommodate different chip sizes, a dice shake loader and a reflow furnace. The only axial piece parts which need to be maintained in inventory are the terminal leads in a few different diameters. All the remaining components and dices needed for this axial assembly are shared with a surface mount product line, thereby creating a potentially huge cost savings.

Another advantage is that the fabrication process can be readily automated. Thus, the conventional manual loading and stacking process used to form axial packages is replaced by an automatic process that is similar to a surface mount dice soldering process. Additionally, the manual loading needed in the furnace reflow step is also eliminated.

Yet another advantage that arises from the axial assembly design described above is that consistent quality control can be better maintained. In part this is because the use of flux for dice soldering and cleaning can provide better solder wetting and fewer solder voids. The nature of the automatic process also reduce the likelihood of lot-to-lot inconsistencies.

Moreover, the process used to fabricate the axial assembly design described above can readily accommodate design changes. For instance, when the chip size is changed, it is not necessary to redesign the die pads and stacking boat. Existed surface mount packages, such as SMA, SMB and SMC, each accommodate a certain range of chip sizes. In the event that a change in chip size requires a different die pad and a change from one package to another package (e.g., from SMC to SMB), such a change can still be made in the new process. As long as the sub-assembly is matched and connected to a lead with the appropriate diameter, it can be molded to form any axial package. Thus, the fabrication process is very flexible with respect to design changes.

In some implementations the axial lead can be a Sn pre-plated lead, which can be joined to the die pads by laser welding. In this way the resulting axial component will not need another lead plating. As a consequence, the plating costs are reduced. Moreover, there is no risk of lead deformation during the plating process. As a result, a high assembly yield can be maintained, which leads to lower manufacturing costs.

Figure 3:
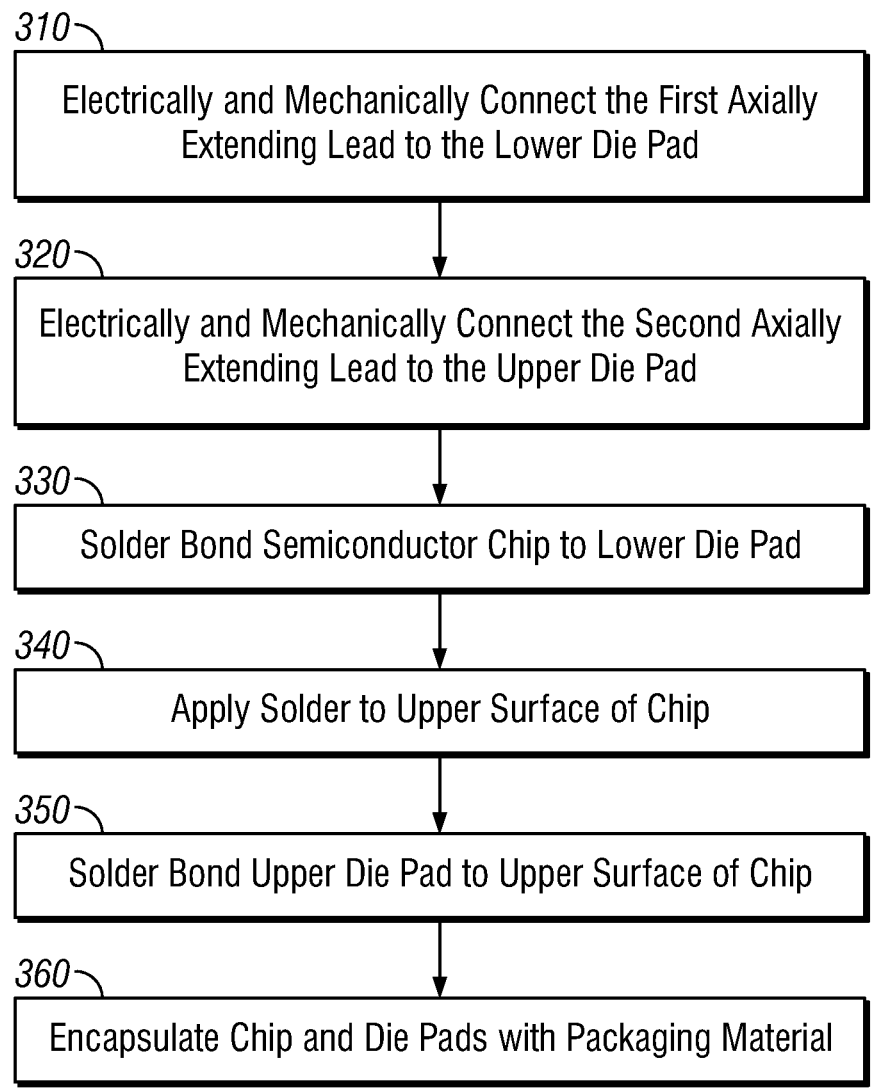
FIG. 3 is flowchart showing one example of a process for producing an axially-mountable device.

FIG. 3 is flowchart showing one example of a process for producing an axially-mountable device. The method begins in step 310 when the first axially extending lead is electrically and mechanically connected to the lower die pad. In addition, in step 320, the second axially extending lead is electrically and mechanically connected to the upper die pad. A semiconductor chip is solder bonded to lower die pad in step 330. Solder is applied to upper surface of chip in step 340 and the upper die pad is solder bonded to the lower die pad in step 350. Finally, in step 360 the chip and die pads are encapsulated with packaging material.

Figure 4:
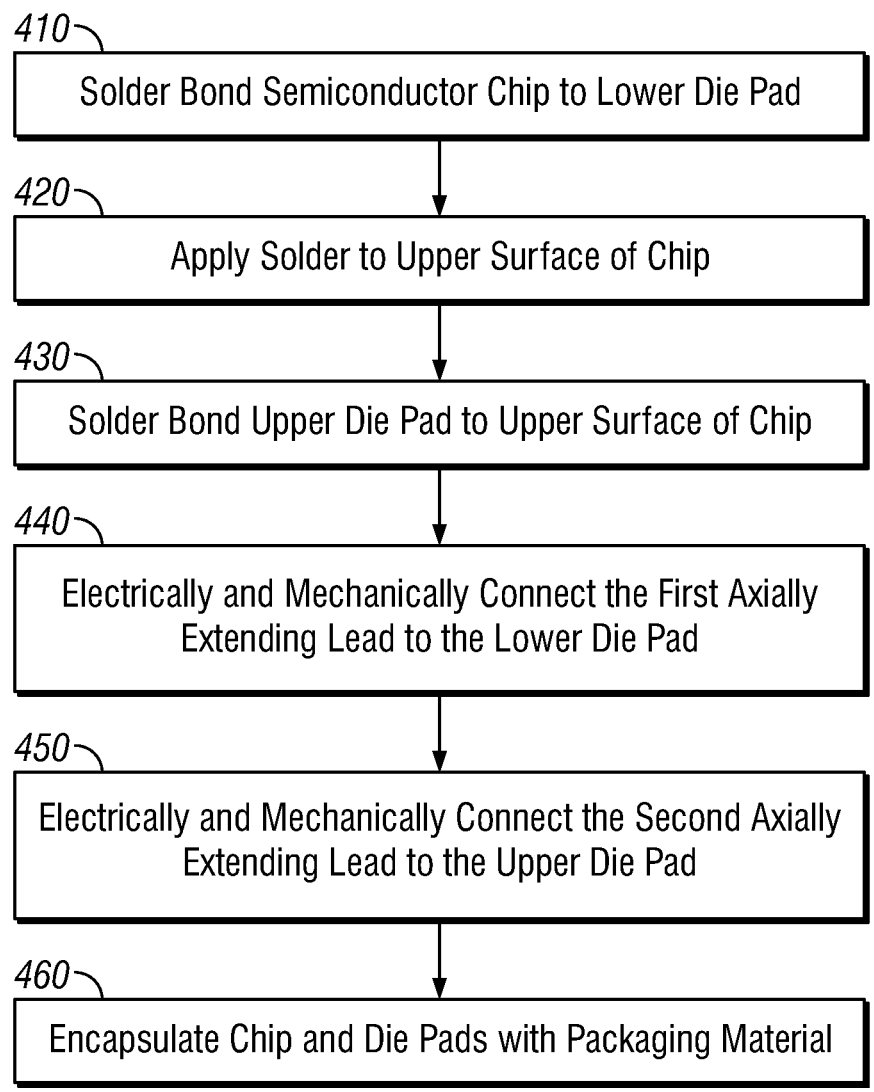
FIG. 4 is flowchart showing another example of a process for producing an axially-mountable device.

FIG. 4 is flowchart showing another example of a process for producing an axially-mountable device. The method begins in step 410 when a semiconductor chip is solder bonded to a lower die pad. Solder is applied to an upper surface of the chip in step 420 and the upper die pad is solder bonded to the lower die pad in step 430. In step 440 the first axially extending lead is electrically and mechanically connected to the lower die pad. In addition, in step 450 the second axially extending lead is electrically and mechanically connected to the upper die pad. Finally, in step 460 the chip and die pads are encapsulated with packaging material.

Of course, as previously mentioned in other implementations the bond between the semiconductor chip 115 and the die pad 120 and the bond between the semiconductor chip 115 and the die pad 130 can be formed at the same time. One advantage of this approach is that the solder used to bond the chip 115 to the die pad 120 may have the same fusing temperature as the solder used to bond the chip to the die pad 130.

The above examples and disclosure are intended to be illustrative and not exhaustive. These examples and description will suggest many variations and alternatives to one of ordinary skill in this art. All these alternatives and variations are intended to be included within the scope of the attached claims. Those familiar with the art may recognize other equivalents to the specific embodiments described herein which equivalents are also intended to be encompassed by the claims attached hereto.

The invention claimed is:

1. An axially-mountable device comprising:
  (a) a semiconductor chip comprising lower and upper electrical contacts;
  (b) a lower die pad electrically and mechanically connected to the lower electrical contact of the chip;
  (c) an upper die pad electrically and mechanically connected to the upper electrical contact of the chip;
  (d) a first axially extending electrical lead electrically and mechanically connected to the upper die pad and extending in a first axial direction;

(d) a second axially extending electrical lead electrically and mechanically connected to the lower die pad and extending in a second axial direction that is opposite to the first axial direction;

(e) packaging material encapsulating the semiconductor chip, the upper and lower die pads and a portion of the first and second axially extending leads; and wherein the first and second leads extend from said packaging material and are adapted to allow the device to be axially-mounted with another electrical component, the first and second leads extending along a common longitudinal axis and the lower and upper die pads extend in a plane that includes the longitudinal axis.

2. The axially-mountable device of claim 1 wherein the upper and lower die pads are respectively connected to the first and second leads by a solder joint.

3. The axially-mountable device of claim 1 wherein the upper and lower die pads are respectively connected to the first and second leads by a laser weld.

4. The axially-mountable device of claim 1 wherein the upper die pad extends in an upper plane and the lower die pad extends in lower plane, wherein the upper and lower planes are parallel to, and offset from, one another.

5. The axially-mountable device of claim 4 wherein the semiconductor chip is located between the upper and lower planes.

6. The axially-mountable device of claim 1 wherein the packaging material is a housing having a cylindrical configuration.

7. The axially-mountable device of claim 6 wherein the housing has a cylindrical axis that is parallel to the common longitudinal axis.

8. The axially-mountable device of claim 1 wherein the packaging material is a housing having a rectangular configuration.

9. The axially-mountable device of claim 1 wherein the semiconductor chip is a power diode.

10. The axially-mountable device of claim 1 wherein the semiconductor chip is a transient voltage suppressor.

11. The axially-mountable device of claim 1 wherein the semiconductor chip is an LED.

12. The axially-mountable device of claim 1 wherein the semiconductor chip is solder bonded to the upper and lower die pads.

* * * * *